United States Patent [19]
Platt et al.

[11] Patent Number: 5,126,685
[45] Date of Patent: Jun. 30, 1992

[54] CIRCUITS FOR LINEAR CONVERSION BETWEEN VOLTAGES AND CURRENTS

[75] Inventors: John C. Platt, Mountain View; Michael F. Wall, Sonnyvale; Glenn E. Gribble, San Jose; Carver A. Mead, Pasadena, all of Calif.

[73] Assignee: Synaptics, Incorporated, San Jose, Calif.

[21] Appl. No.: 746,962

[22] Filed: Aug. 19, 1991

Related U.S. Application Data

[62] Division of Ser. No. 629,470, Dec. 18, 1990.

[51] Int. Cl.$^5$ .............................................. H03F 3/16
[52] U.S. Cl. ...................................... 330/85; 330/277
[58] Field of Search ................. 307/530; 330/85, 109, 330/277, 291

[56] References Cited

U.S. PATENT DOCUMENTS 4,492,931  1/1985  Deweck ........................ 330/109 X
4,562,406  12/1985  Baker ................................. 330/85

OTHER PUBLICATIONS

Bolt, Klaas, et al., "A Class of Araloy CMOS Circuits Based on the Square Law Characteristics of an MOS Transistor in Saturation", IEEE J. S. S. Ckts, vol. SC-22, No. 3, Jun. 1987, pp. 357-365.

Seevinck, Evert, et al., "A Versitile CMOS Linear Transconductor/Square-Law Function Circuit", IEEE J. S. S. Ckts, vol. SC-22, No. 3, Jun. 1987, pp. 366-377.

Primary Examiner—Steven Mottola
Attorney, Agent, or Firm—Kenneth D'Alessandro

[57] ABSTRACT

A linear voltage-to-current converter (LVCC) circuit includes two transistors, one P-channel and one N-channel. The input voltage is applied to the gates of both transistors. The drains of the two transistors are connected. The source of the p-type transistor is connected to a first voltage rail, and the source of the N-channel is connected to a second voltage rail of lower voltage. The output is the difference between the current through the P-channel transistor and the N-channel transistor. A linear current-to-voltage converter (LCVC) circuit is similar to the LVCC circuit, except that the gates of the transistors are tied to the drains of the transistors. The input current is supplied to the drains, and the output voltage is the voltage of the drains.

2 Claims, 8 Drawing Sheets

1

CIRCUITS FOR LINEAR CONVERSION BETWEEN VOLTAGES AND CURRENTS

RELATED APPLICATIONS

This application is a division of co-pending application Ser. No. 07/629,470, filed Dec. 18, 1990.

BACKGROUND OF THE INVENTION

1. Field Of The Invention

The present invention relates to electronic circuits and to circuits which may be integrated on a single piece of material to form an integrated circuit. More specifically, the present invention relates to circuits for performing linear conversion between voltages and currents.

2. The Prior Art

There are known circuits in the prior art which use CMOS transistors to convert voltage to current in a linear fashion. Much work has been done using CMOS transistors in their ohmic region. For example, the paper Y. Tsividis, M. Banu, J. Khoury, "*Continuous Time MOSFET-C Filters in VLSI, IEEE Trans. on Circuits and Systems*", Vol. CAS-33, pp. 125–140 (1986), describes use of multiple transistors to cancel the non-linearity of transistors while they are operating in their ohmic region. The circuits described draw current from the input node. Also, because transistors are used in their ohmic regime, the input voltage range of the circuits is limited The circuits described therein can also be used as linear continuous time multipliers.

There has also been work using CMOS transistors in saturation for the conversion of voltage to current. The work describes use of a special process to generate depletion mode devices. This work is discussed in the paper P. A. Shoemaker, I. Lagnado, R Shimabukuro, "*Artificial Neural Network Implementations with Floating Gate MOS Devices*", from the proceedings "Hardware Implementations of Neural Nets and Synapses", NSF/ONR Workshop, P. Mueller, ed. The same research group published further work on adaptation of the circuits: R. L. Shimabukuro, R. E. Reedy, G. AA. Garcia, "*Dual Polarity Nonvolatile MOS Analog Memory (MAM) Cell for Neural-Type Circuitry*", Electronics Letters, Vol. 24, No. 19, pp. 1231–1232, Sep. 15, 1988.

No work is known to the inventors involving the use of saturated MOS transistors in linear voltage/current conversion circuits which do not draw input current and which can be fabricated using a conventional CMOS process.

BRIEF DESCRIPTION OF THE INVENTION

A first aspect of the present invention includes circuits which linearly convert a voltage to a current and circuits which linearly convert a current to a voltage.

The linear voltage-to-current converter (LVCC) circuit includes two transistors, one P-channel and one N-channel. The input voltage is applied to the gates of both transistors. The drains of the two transistors are connected. The source of the p-type transistor is connected to a first voltage rail, and the source of the N-channel is connected to a second voltage rail of lower voltage The output is the difference between the current through the P-channel transistor and the N-channel transistor. The linear current-to-voltage converter (LCVC) circuit is similar to the LVCC circuit, except that the gates of the transistors are tied to the drains of the transistors. The input current is supplied to the drains, and the output voltage is the voltage of the drains.

BRIEF DESCRIPTION OF THE DRAWINGS

FIG. 2 is a graph showing a family of exemplary transfer curves for the LVCC circuit of FIG. 1a.

FIG. 7 is a graph showing the transfer function of the LCVC circuit of FIG. 6a.

DETAILED DESCRIPTION OF A PREFERRED EMBODIMENT

The circuits disclosed within the scope of the present invention are readily integrable utilizing state of the art integrated circuit fabrication techniques. Such techniques are well within the general level of skill in the art of integrated circuit design and will not be included herein in order to avoid unnecessarily complicating the disclosure.

As an introductory matter, understanding the definitions of some terms used throughout the specification and claims will facilitate an understanding of the present invention. If the threshold voltage of a P-channel transistor is expressed as $V_{Tp}$ and the threshold voltage of an N-channel transistor is expressed as $V_{Tn}$, a P-channel transistor will be operating above threshold when its gate voltage is more negative than $|V_{Tp}|$ with respect to its source, and an N-channel transistor will be operating above threshold when its gate voltage is more positive than $|V_{Tn}|$ with respect to its source. Saturation, as that term is used herein, is defined 14 for a P-channel transistor as the condition when its gate voltage is no more than $|V_{Tp}|$ more negative than its drain voltage. For an N-channel transistor, saturation is defined as the condition where its gate voltage is no more than $|V_{Tn}|$ more positive than its drain voltage. For transistors operating in their subthreshold regions, saturation occurs when the transistor's drain voltage is a few kt/q units above its source voltage, independent of gate voltage, as explained in the book *Analog VLSI and Neural Systems*, Carver A. Mead, p. 37, Addison Wesley Pub. Co. 1989.

Figure 1A:
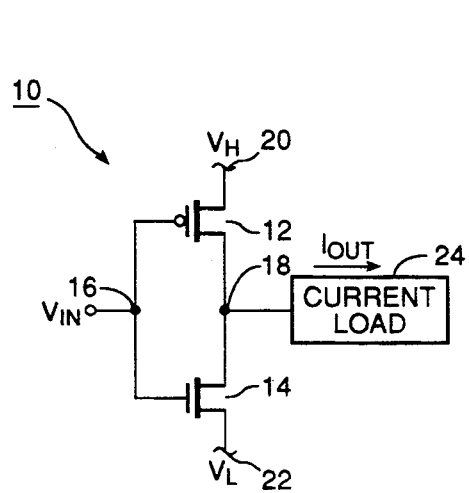
FIGS. 1a and 1b are schematic diagrams of linear voltage-to-current converter circuits according to a presently preferred embodiment of the invention.

According to a presently preferred embodiment of the invention as shown in FIG. 1a, a linear voltage-to-current converter (LVCC) circuit 10 includes two MOS transistors, one P-channel transistor 12 and one N-channel transistor 14. An input voltage $V_{in}$ is applied from an input voltage node 16 to the gates of both transistors 12 and 14, which are connected together. The drains of transistors 12 and 14 are connected together to form an output node 18. The source of the P-channel transistor 12 is connected to a voltage rail 20 having a first voltage potential $V_H$, and the source of the N-channel transistor 14 is connected to a voltage rail 22 having a second voltage potential $V_L$, more negative than $V_H$. Output node 18 is connected to a current load 24.

For the purposes of the present invention, a current load is an element or circuit configuration which utilizes the output current while maintaining the output voltage within a restricted range, such that both P-channel transistor 12 and N-channel transistor 14 are kept in saturation. Such an element includes, but is not limited to, a low-resistance value resistor or a conventional current-sense amplifier.

At first glance, the circuit of FIG. 1a appears to be a common inverter circuit. However, when the transistors 12 and 14 are sized and the circuit is operated according to the principles disclosed herein, those of ordinary skill in the art will appreciate that a novel circuit having novel properties is disclosed.

The current output $I_{out}$ of LVCC circuit 10 at output node 18 is the difference between the current through P-channel transistor 12 and the current through N-channel transistor 14. As the input voltage increases and N-channel transistor 14 remains in saturation, the current through N-channel transistor 14 increases quadratically above threshold. As the input voltage increases, and P-channel transistor 12 remains in saturation, the current through P-channel transistor 12 decreases quadratically above threshold.

According to the principles of the present invention, the magnitudes of the voltages $V_H$ and $V_L$ at the sources of both MOS transistors 12 and 14 are chosen so that the quadratic behavior of MOS transistors 12 and 14 overlap. By choosing the ratio of the sizes of the transistors according to the principles of the present invention, the quadratic dependance of the current through P-channel transistor 12 balances the quadratic dependance of the current through N-channel transistor 14. The output current $I_{out}$ at output node 18 then becomes linearly dependent on the input voltage $V_{in}$ at node 16.

The output current can be approximated mathematically. When both transistors are in saturation and above threshold according to the present invention, the output current, $I_{out}$, is:

$$I_{out} = \frac{k\mu_p w_p}{l_p} (V_{in} - V_H - V_{Tp})^2 - \frac{k\mu_n w_n}{l_n} (V_{in} - V_L - V_{Tn})^2 \quad (1)$$

where $V_{in}$ is the input voltage at node 16, $V_H$ is the voltage of the higher voltage rail 20, $V_L$ is the voltage of the lower voltage rail 22, $V_{Tp}$ is the threshold voltage of P-channel transistor 12, $V_{Tn}$ is the threshold voltage of N-channel transistor 14, $\mu_p$ is the mobility of P-channel transistor 12, $\mu_n$ is the mobility of N-channel transistor 14, $w_p$ is the width of P-channel transistor 12, $w_n$ is the width of N-channel transistor 14, $l_p$ is the length of P-channel transistor 12, $l_n$ is the length of N-channel transistor 14, and k is a constant of proportionality.

The sizing of the transistors 12 and 14 affects the performance of the circuit. According to a presently preferred embodiment of the invention, the widths and the lengths of MOS transistors 12 and 14 are chosen such that:

$$\frac{\mu_p w_p}{l_p} = \frac{\mu_n w_n}{l_n} = R \quad (2)$$

When MOS transistors 12 and 14 are so sized, then the quadratic dependance of the output current on the input voltage is canceled, leaving only a linear dependence:

$$I_{out}kR[(V_H + V_{Tp})^2 - (V_L + V_{Tn})^2 + 2(V_L - V_H + V_{Tn} - V_{Tp})V_{in}] \quad (3)$$

This equation reduces to:

$$I_{out} = \quad (4)$$

-continued $$2kR(V_L - V_H + V_{Tn} - V_{Tp})\left[V_{in} = \frac{V_L + V_H + V_{Tn} + V_{Tp}}{2}\right]$$

The linear dependance of the output current $I_{out}$ on the input voltage $V_{in}$ can be controlled by changing the difference between the higher voltage source and the lower voltage source. As the difference increases, the slope of the current-voltage transfer curve increases linearly. This is illustrated by the family of exemplary transfer curves for the LVCC circuit shown in FIG. 2.

According to the presently preferred embodiment of the invention, the circuit of FIG. 1a is operated such that both MOS transistors 12 and 14 are operating in regions above threshold and in saturation. Both MOS transistors 12 and 14 are operating above threshold when:

$$V_{in} - V_{Tp} < V_H \quad (5)$$

$$V_{in} - V_{Tn} > V_L \quad (6)$$

In addition, both MOS transistors 12 and 14 are in saturation when:

$$V_{in} - V_{Tp} > V_{out} \quad (7)$$

$$V_{in} - V_{Tn} < V_{out} \quad (8)$$

where $V_{out}$ is the output voltage at output node 18.

The circuit of FIG. 1a operates according to the present invention as an LVCC circuit when:

$$V_L < V_{in} - V_{Tn} < V_{out} < V_{in} - V_{Tp} < V_H \quad (9)$$

With a suitable choice of voltages $V_H$ and $V_L$ for the voltage rails 20 and 22, the input voltage range over which the transfer function of the circuit of FIG. 1a is linear can be increased. If the N-channel transistor 14 falls out of saturation when the P-channel transistor 12 falls below threshold, and the P-channel transistor 12 falls out of saturation when the N-channel transistor 14 falls below threshold, then the output current $I_{out}$ is a linear function of the input voltage $V_{in}$, while the input voltage is between the voltage rails. The condition for wide-range linearity is:

$$V_H + V_{Tp} - V_{Tn} = V_{out} = V_L + V_{Tn} - V_{Tp} \quad (10)$$

Figure 2:
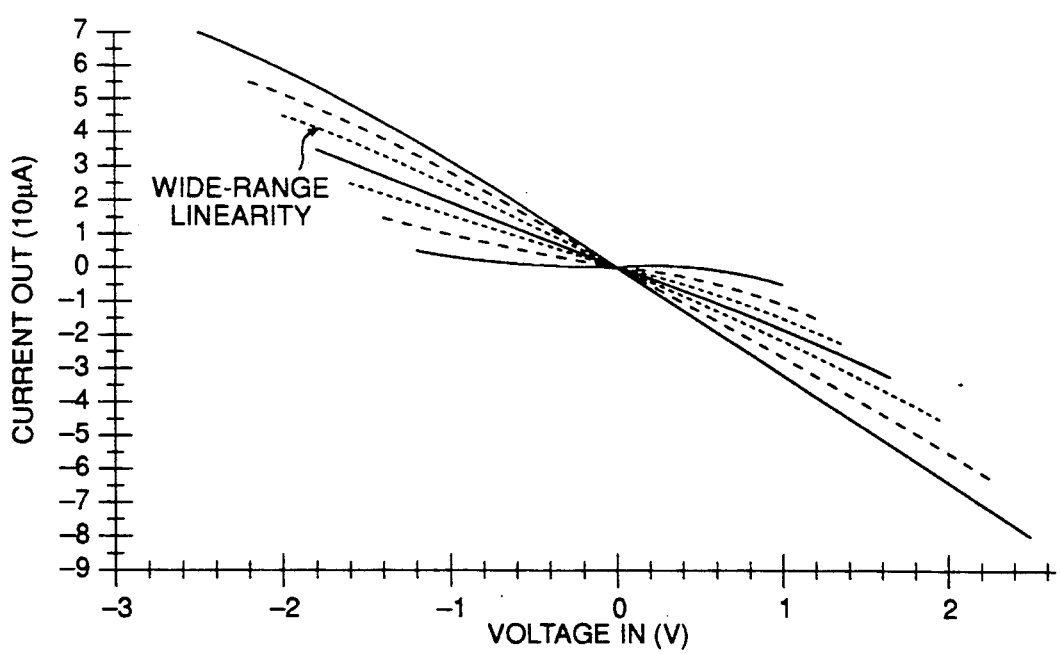

The transfer function for wide range linearity is also shown in FIG. 2. The different curves of FIG. 2 represent the transfer function for different values of $V_L$.

In common electronics practice, resistors can be used as linear voltage-to-current conversion elements, but are often inappropriate for that use in a monolithic integrated circuit using MOS technology. The LVCC circuits of the present invention are superior for use in monolithic CMOS integrated circuits because their transconductance can be controlled and they draw no current from their input node.

Figure 1B:
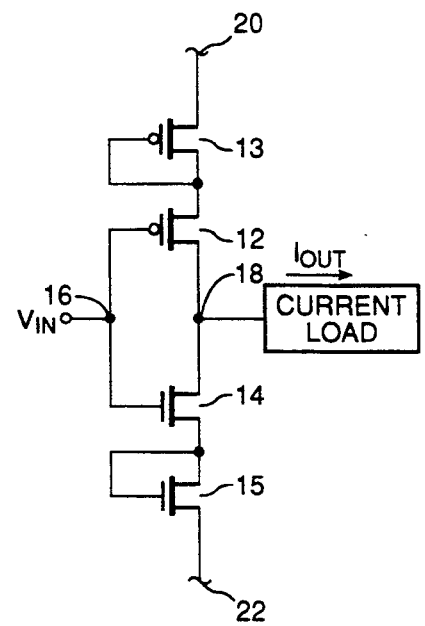

Referring now to FIG. 1b, another embodiment of a LVCC circuit according to the present invention is shown. The circuit is identical to the LVCC circuit of FIG. 1 with the addition of diode-connected P-channel MOS transistor 13 between the source of P-channel transistor 12 and its voltage rail 20 and diode-connected N-channel MOS transistor 15 between the source of N-channel transistor 14 and its voltage rail 22. The circuit of FIG. 1b has some advantages over the circuit of FIG. 1a in that it shows linear behavior over a wider range of input voltage range for a given current through the transistors. If sufficient power supply voltage is available, those of ordinary skill in the art will readily see that additional diode-connected transistors may be added to achieve an even wider voltage range over which linear behavior will be exhibited.

Figure 3:
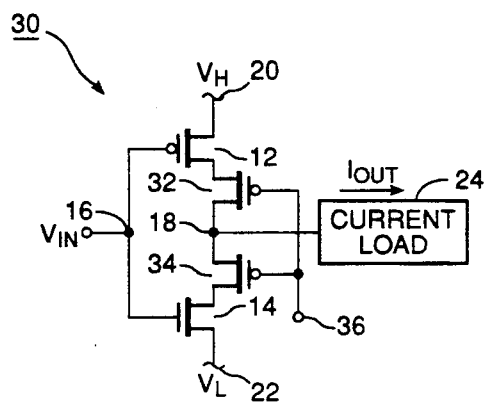
FIG. 3 is a schematic diagram of a two-quadrant linear multiplier according to a presently preferred embodiment of the invention.

The LVCC circuit of FIG. 1a can be modified to yield a two-quadrant linear multiplier as shown with reference to FIG. 3. Referring to FIG. 3, two-quadrant linear multiplier circuit 30 includes P-channel transistor 12, and N-channel transistor 14 of the LVCC circuit of FIG. 1a, having their sources connected to voltage rails 20 and 22 and their gates connected together to input node 16. The circuit also includes P-channel switching transistors 32 and 34 connected in series between the drains of transistors 12 and 14. The gates of transistors 32 and 34 are connected together to a switched input 36. Like the LVCC circuit 10 of FIG. 1a, the output node 18 of the circuit of FIG. 3 is connected to a current load 24.

The two-quadrant linear multiplier circuit 30 is operated within the same limits disclosed with respect to the LVCC circuit of FIG. 1a. When it is operated within these limits, the output current $I_{out}$ can be turned on for a selected amount of time using the switched input 36. The amount of charge transferred to the output node 18 by the multiplier circuit is proportional to both the input voltage $V_{in}$ and the amount of time that the switched input 36 is activated by placing it at a low voltage such as $V_L$. Those of ordinary skill in the art will recognize that switched input 36 may be made high active by using N-channel transistors in place of P-channel transistors 32 and 34.

Figure 4:
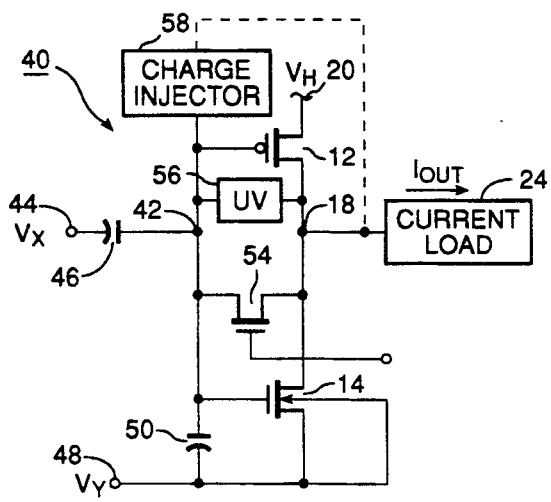
FIG. 4 is a schematic diagram of a continuous time two-quadrant linear multiplier according to a presently preferred embodiment of the invention.

Referring now to FIG. 4, a linear, continuous-time, two-quadrant multiplier (LCTM) circuit 40 according to the present invention is shown. According to a presently preferred embodiment, LCTM circuit 40 includes a LVCC circuit of FIG. 1a, having P-channel and N-channel transistors 12 and 14. The source of P-channel transistor 12 is connected to a voltage rail 20 having a voltage of $V_H$ on it. The gates of P-channel transistor 12 and N-channel transistor 14 are connected together to a floating input node 42. The drains of P-channel transistor 12 and N-channel transistor 14 are connected together to an output node 18. Floating node 42 is coupled to a first input node 44 by a first capacitor 46. The source of N-channel transistor 14 is connected to a second input node 48, which is coupled to floating node 42 by a second capacitor 50. In a p-well CMOS process, the source of N-channel transistor 14 is connected to its substrate, which is the isolated well in which the transistor is fabricated. For an n-well process, the conductivity types of the P-channel and N-channel transistors 12 and 14 are reversed. A first input voltage $V_x$ is presented at first input node 44 and a second input voltage $V_y$ is presented at second input node 48. The voltage $V_z$ on floating node 42 is determined by the first and second input voltages $V_x$ and $V_y$ on nodes 44 and 48.

The capacitors 46 and 50 serve as a voltage divider for the voltage $V_z$ on floating node 42 such that:

$$V_z = V_{z0} + \left(\frac{C_x V_x + C_y V_y}{C_x + C_y + C_0}\right) \quad (11)$$

is the voltage on floating node 42, $V_x$ is the input voltage on the first input node 44, $V_y$ is the input voltage on the second input node 48, $V_{z0}$ is the voltage on floating node 42 when $V_x = V_y = 0$, $C_x$ is the capacitance of capacitor 46, $C_y$ is the capacitance of capacitor 50, $C_0$ is the parasitic capacitance of the floating node 42.

If $\alpha$ is defined as:

$$\alpha = \frac{C_x}{(C_x + C_y + C_0)} \quad (12)$$

and $\beta$ is defined as:

$$\beta = \frac{C_y}{(C_x + C_y + C_0)} \quad (13)$$

the current output $I_{out}$ of the LCTM may be expressed as:

$$I_{out} = \quad (14)$$

$$2kR(V_y - V_H + V_{Tn} -$$

$$V_{Tp})\left[ V_{z0} + \alpha V_x + \beta V_y - \frac{V_y + V_H + V_{Tn} + V_{Tp}}{2} \right]$$

When transistors 12 and 14 are above threshold and in saturation.

The capacitors 46 and 50 are selected so that $\beta = \frac{1}{2}$ or $C_y = C_x + C_0$, and the output current $I_{out}$ is a linear function of $V_y$. When the capacitances are properly ratioed, the output of the LCTM circuit may be expressed as:

$$I_{out} = 2\alpha kR(V_y - V_{Y0})(V_x - V_{x0}) \quad (15)$$

where $V_{x0} = (V_{z0} + 0.5(V_H + V_{Tn} + V_{Tp}))/\alpha$ and $V_{y0} = V_H + V_{Tp} - V_{Tn}$.

The value $V_{x0}$ can be set by using a number of different analog storage methods to initialize the floating node. According to a first method, a transistor 54 may be connected between the floating node 42 and the output node 18 of the multiplier. The second method consists of connecting a UV coupler 56 between the floating node 42 and the output node 18 of the multiplier as disclosed in U.S. Pat. No. 4,935,702 to Mead et al., issued Jun. 19, 1990. The third method consists of connecting an injector/tunneling device 58 to the floating node 42, which may be controlled by the output node 18 of the multiplier circuit 40 (shown by the dashed connection line) or by other mechanisms, such as are disclosed in U.S. Pat. No. 4,953,928 to Anderson et al., issued Sep. 4, 1990, which is expressly incorporated herein by reference. In all of these methods of controlling floating node 42, the first input node 44 of the multiplier circuit 40 should be set to the voltage $V_{x0}$, the second input node 48 should be at a voltage somewhere within the normal operating range of the circuit, and the output node 18 should be isolated from any other circuit element.

Figure 5:
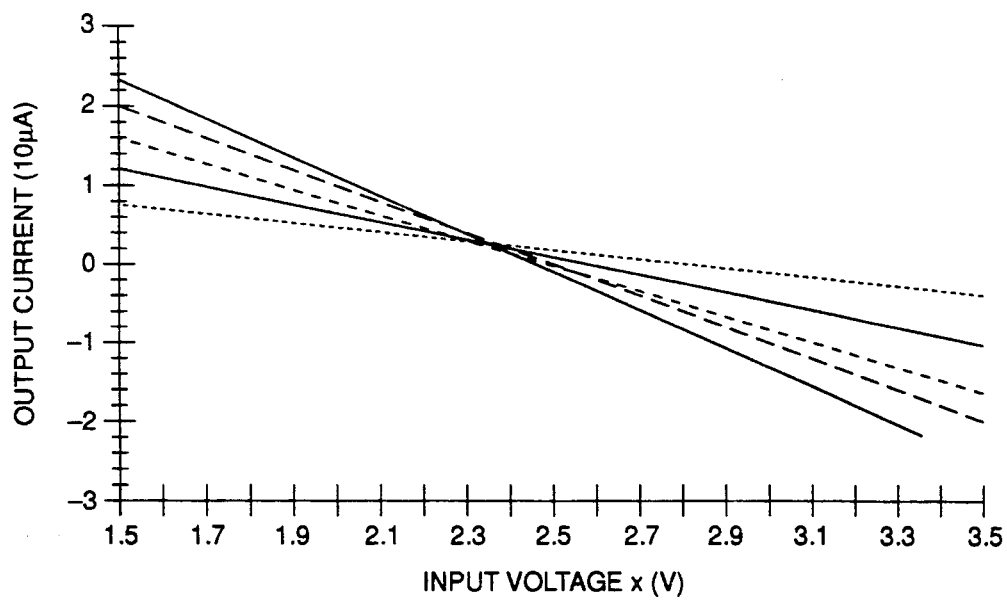
FIG. 5 is a graph showing the transfer function for the circuit of FIG. 4, illustrating the output current as a function of the input voltage $V_x$ for various values of the input voltage $V_y$.

The transfer function for the LCTM circuit 40 of FIG. 4 is shown in FIG. 5. The output current $I_{out}$ is shown in FIG. 5 as a function of the input voltage $V_x$ for various values of the input voltage $V_y$.

Another aspect of the present invention is a circuit useful as a linear current-to-voltage converter (LCVC). An LCVC circuit according to a presently preferred embodiment of the invention is disclosed with reference to FIG. 6a. An LCVC circuit 60 includes two MOS transistors, one P-channel transistor 12 and one N-channel transistor 14. An input current $I_{in}$ is applied from an input node 16 to the gates of both transistors 12 and 14, which are connected together. The drains of transistors 12 and 14 are connected together to form an output node 18. The output node 18 is connected to the input node 16. The source of the P-channel transistor 12 is connected to a voltage rail 20 having a first voltage potential $V_H$, and the source of the N-channel transistor 14 is connected to a voltage rail 22 having a second lower voltage potential $V_L$.

Figure 6A:
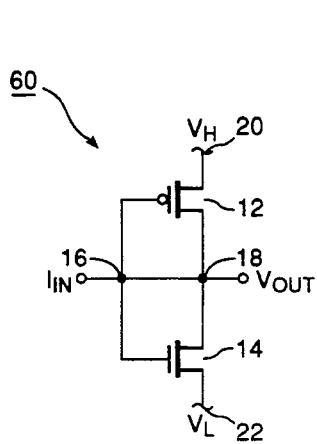
FIGS. 6a and 6b are schematic diagrams of linear current-to-voltage converter (LCVC) circuits according to a presently preferred embodiment of the present invention.

The circuit of FIG. 6a is an example of a current load depicted in FIGS. 1a, 1b, 3 and 4. This circuit may be combined with these circuits as disclosed herein to provide useful circuit functions.

LCVC circuit 60 of FIG. 6a is similar to the LVCC circuit 10 FIG. 1, except that the gates of the transistors 12 and 14 are tied to their common drain connection at output node 18. The input current $I_{in}$ is supplied to the drains, and the output voltage $V_{out}$ is the common drain voltage of transistors 12 and 14 (i.e., the voltage at node 18).

Kirchoff's current law requires that the current going into the drains of transistors 12 and 14 equal the current flowing out of the drains of those transistors. At steady state, the output voltage $V_{out}$ should cause the two transistors 12 and 14 to supply enough current to balance the input current $I_{in}$. When the size ratio of MOS transistors 12 and 14 is correctly selected, the current supplied by MOS transistors 12 and 14 is a linear function of the gate voltage, and the output voltage is a linear function of the input current $I_{in}$.

Figure 7:
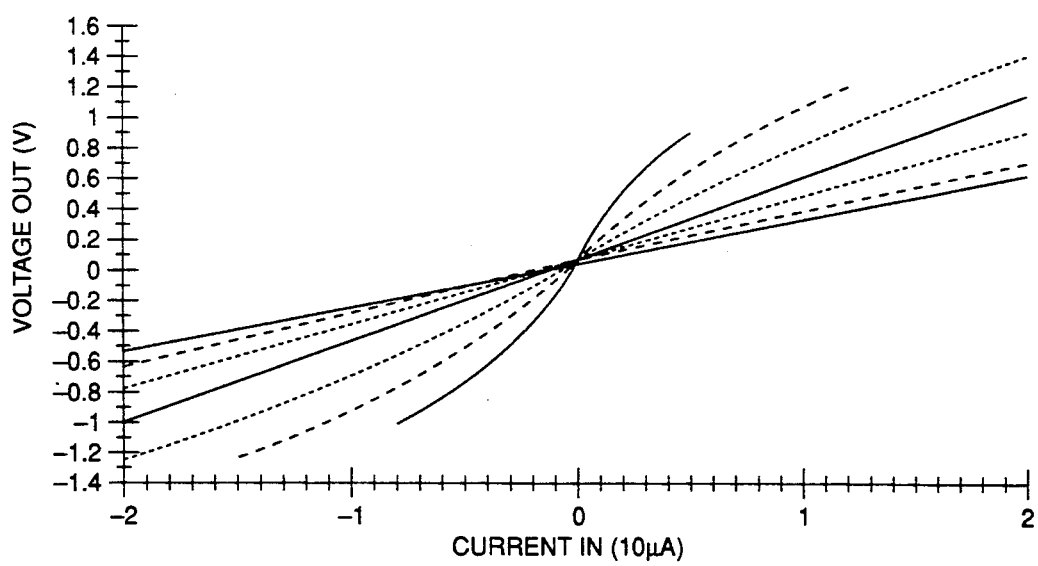

The transfer function of the LCVC circuit of FIG. 6a is shown in FIG. 7. The different curves of FIG. 7 depict the transfer function for different values of $V_L$.

When both transistors are above threshold and in saturation, the equation describing current balance for the LCVC circuit 60 of FIG. 6a is:

$$I_{in} + \frac{k\mu_p w_p}{l_p}(V_{out} - V_H - V_{Tp})^2 - \quad (16)$$

$$\frac{k\mu_n w_n}{l}(V_{out} - V_L - V_{Tn})^2 = 0$$

When the sizes of transistors 12 and 14 satisfy equation (2), then the quadratic terms involving $V_{out}$ cancel, yielding a linear transfer function:

$$V_{out} = \frac{I_{in}}{2kR(V_H - V_L + V_{Tp} - V_{Tn})} + \frac{V_L + V_H + V_{Tp} + V_{Tn}}{2} \quad (17)$$

Equation (17) is valid whenever both transistors are operating in a region above threshold. Because both transistors are diode-connected, they are always in saturation. Therefore, the LCVC circuit 60 of FIG. 6a is useful when:

$$V_L + V_{Tn} < V_{out} < V_H + V_{Tp} \quad (18)$$

Figure 6B:
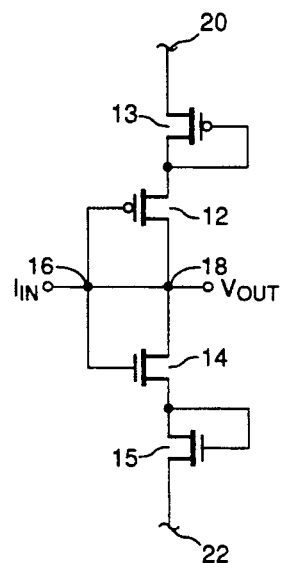

Referring now to FIG. 6b, another embodiment of a LCVC circuit according to the present invention is shown. The circuit is identical to the LCVC circuit of FIG. 6a with the addition of diode connected P-channel MOS transistor 13 between the source of P-channel transistor 12 and its voltage rail 20 and diode connected N-channel MOS transistor 15 between the source of N-channel transistor 14 and its voltage rail 22. The circuit of FIG. 6b has some advantages over the circuit of FIG. 6a in that it shows linear behavior over a wider range of input current range for a given current through the transistors. If sufficient power supply voltage is available, those of ordinary skill in the art will readily see that additional diode connected transistors may be added to achieve an even wider current range over which linear behavior will be exhibited.

From the disclosure herein, those skilled in the art can readily appreciate that the LCVC and LVCC circuits 10 and 60 and variations disclosed herein can be connected together in various ways, to yield various combinations of mirroring and inverting functions. The present invention includes these combinations. Several examples of more complex circuit systems according to the present invention will now be disclosed.

Figure 8A:
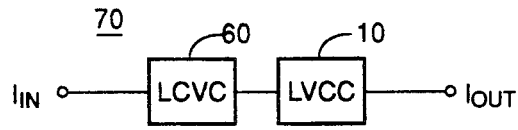
FIG. 8a is a block diagram of a current negator (CN) circuit according to the present invention showing it to be a combination of an LCVC circuit driving a LVCC circuit.

Referring now to FIG. 8a, one useful circuit which may be configured according to the present invention from combinations of the circuits disclosed herein is a current-negator (CN) circuit. A current negator circuit in its basic form according to the present invention supplies an output current equal in magnitude and opposite in sign to an input current.

A CN circuit 70 according to the present invention, shown in block form in FIG. 8a, is a combination of the LCVC circuit 60 of FIG. 6a or 6b driving the LVCC circuit 10 of FIG. 1a or 1b. The output of the LCVC circuit 60 is the input to the LVCC circuit 10. The input current $I_{in}$ of the CN circuit 70 is the input to the LVCC portion 60 of the circuit. The output $I_{out}$ of the CN circuit 70 is the output current of the LVCC portion 10 of the circuit.

Figure 8B:
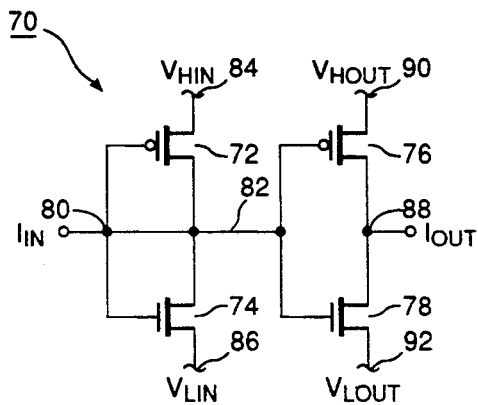
FIG. 8b is a schematic diagram of a CN circuit according to one presently preferred embodiment of the present invention.

Referring now to FIG. 8b, in a first particular embodiment of a CN circuit according to the present invention, CN circuit 70 includes four MOS transistors, one P-channel transistor 72 and one N-channel transistor 74 in the input section and one P-channel transistor 76 and one N-channel transistor 78 in the output section. An input current $I_{in}$ is applied from an input node 80 to the gates of both transistors 72 and 74, which are connected together. The drains of transistors 72 and 74 are connected together to form an intermediate node 82. The intermediate node 82 is connected to the input node 80. The source of the P-channel transistor 72 is connected to a first input voltage rail 84 having a first voltage potential $V_{Hin}$, and the source of the N-channel transistor 74 is connected to a second input voltage rail 86 having a second lower voltage potential $V_{Lin}$.

Intermediate node 82 is connected to the gates of P-channel transistor 76 and N-channel transistor 78. The drains of P-channel and N-channel transistors 76 and 78 are connected together to output node 88. The source of the P-channel transistor 76 is connected to a first output voltage rail 90 having a first voltage potential $V_{Hout}$, and the source of the N-channel transistor 78 is connected to a second output voltage rail 92 having a second voltage potential $V_{Lout}$, more negative than $V_{Hout}$.

The output current $I_{out}$ is the negation of the input current $I_{in}$, i.e. $I_{out}=-I_{in}$, when the transistors of the LCVC portion of the circuit are matched in size to the corresponding transistors of the LVCC portion of the circuit, when the voltages $V_H$ and $V_L$ on the voltage rails of the LCVC portion of the circuit are the same as those of the LVCC portion of the circuit and when the transistors of the LVCC portion of the are in saturation:

$$V_{in}-V_{T7}<V_{out}<V_{in}-V_{T76} \quad (19)$$

where $V_{OUT}$ is the voltage at output node 88, $V_{T76}$ is the threshold of transistor 76, and $V_{T78}$ is the threshold of transistor 78.

Those of ordinary skill in the art will recognize that the LVCC circuit 10 and the LCVC circuit 60 of the CN circuit do not have to be operated above threshold because any non-linearity in the LCVC portion of the circuit will be cancelled by an equivalent non-linearity in the LVCC portion of the circuit.

Figure 8C:
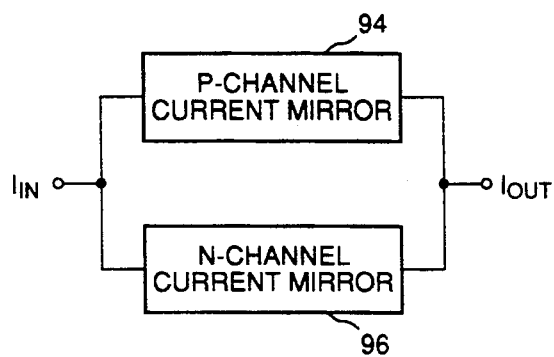
FIG. 8c is a block diagram of a CN circuit according to the present invention, showing it to be the equivalent of two current mirrors sharing input and output nodes.

The CN circuit 70 of the present invention may also be considered to be a pair of current mirrors, one P-channel and one N-channel, sharing the same input and output nodes. Such a pair of current mirrors is depicted in block form in FIG. 8c. One embodiment of the P-channel current mirror 94 comprises transistors 72 and 76 of FIG. 8b. Similarly, one embodiment of the N-channel current mirror 96 comprises transistors 74 and 78 of FIG. 8b.

Figure 9:
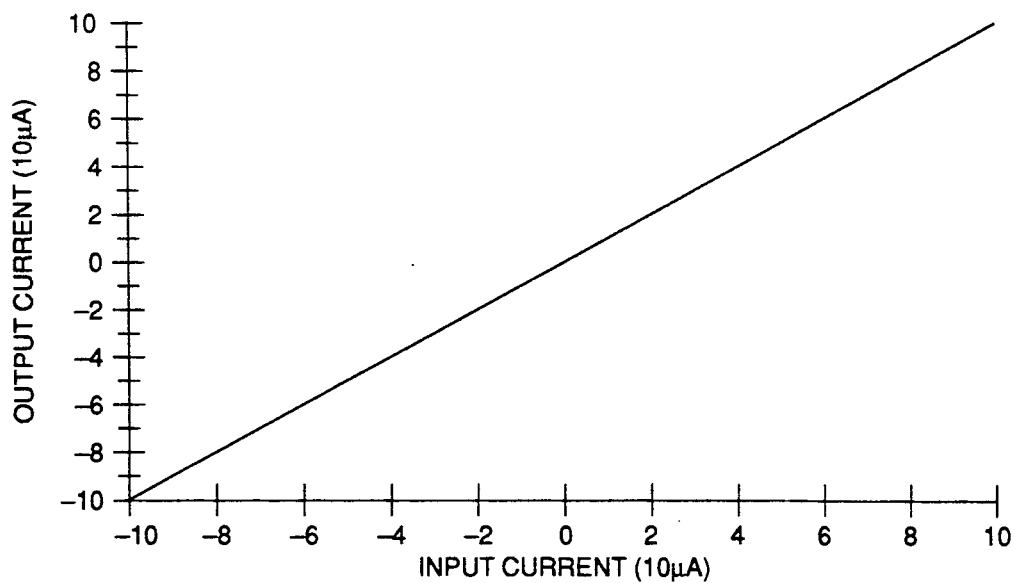
FIG. 9 is a graph showing the transfer function of the CN circuit of FIG. 8b.

The graph of FIG. 9 illustrates the transfer curves for the CN circuit 70 shown in FIG. 8b.

Figure 8D:
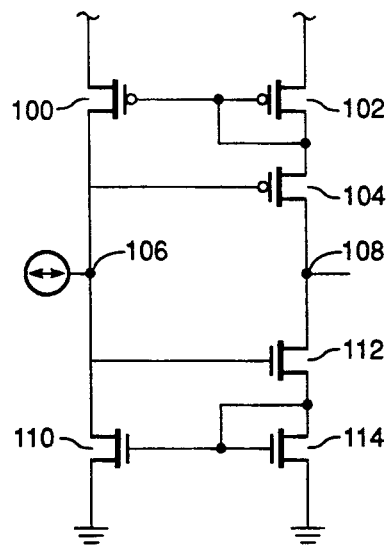
FIG. 8d is a schematic diagram of a CN circuit according to a presently preferred embodiment of the present invention comprising a pair of Wilson current mirrors.

Those of ordinary skill in the art will appreciate that different current mirrors can be substituted for the standard current mirrors used in the circuit of FIG. 8b. Examples of such variations of the present invention are depicted in FIGS. 8d-8g. Referring now to FIG. 8d, a CN circuit according to the present invention includes a pair of Wilson current mirrors. P-channel transistors 100, 102 and 104 form a P-channel current mirror having an input node 106 and an output node 108. N-channel transistors 110, 112, and 114 form an N-channel current mirror sharing input node 106 and output node 108.

Figure 8E:
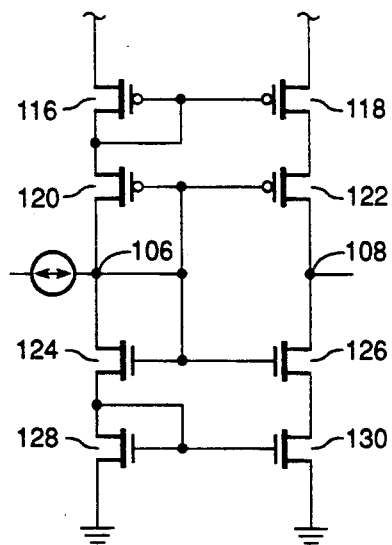
FIG. 8e is a schematic diagram of a CN circuit according to a presently preferred embodiment of the present invention comprising a pair of cascode current mirrors.

Referring now to FIG. 8e, an alternate embodiment of a CN circuit according to the present invention includes a pair of cascode current mirrors. P-channel transistors 116, 118, 120 and 122 form a P-channel current mirror having an input node 106 and an output node 108. N-channel transistors 124, 126, 128 and 130 form an N-channel current mirror sharing input node 106 and output node 108 with the P-channel current mirror.

Figure 8F:
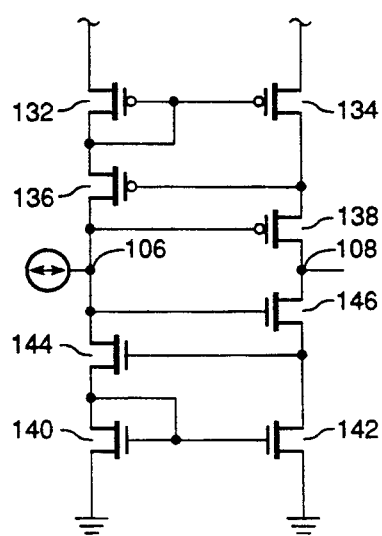
FIG. 8f is a schematic diagram of a CN circuit according to a presently preferred embodiment of the present invention comprising a pair of multiple stage Wilson current mirrors.

Referring now to FIG. 8f, another alternate embodiment of a CN circuit according to the present invention includes a pair of multiple-stage Wilson current mirrors. P-channel transistors 132, 134, 136, and 138 form a multiple stage P-channel current mirror having an input node 106 and an output node 108. N-channel transistors 140, 142, 144, and 146 form an N-channel current mirror sharing input node 106 and output node 108 with the P-channel current mirror.

Figure 8G:
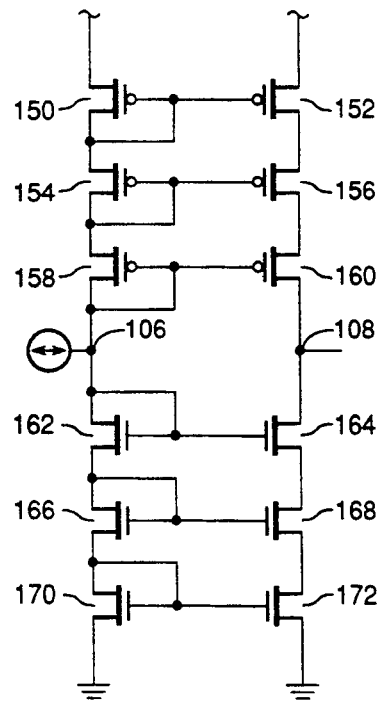
FIG. 8g is a schematic diagram of a CN circuit according to a presently preferred embodiment of the present invention comprising a pair of multiple stage cascode current mirrors.

Referring now to FIG. 8g, yet another CN circuit according to the present invention includes a pair of multiple-stage cascode current mirrors. P-channel transistors 150, 152, 154, 158, 158 and 160 form a multiple stage P-channel current mirror having an input node 106 and an output node 108. N-channel transistors 162, 164, 166, 168, 170, and 172 13 form an N-channel current mirror sharing input node 106 and output node 108 with the P-channel current mirror.

The circuits in FIGS. 8d-8g offer some advantages over the circuit of FIG. 8b. The output impedances of the circuits of FIGS. 8d-8g are much higher than the output impedance of the circuit of FIG. 8b. Therefore, the output portions of the circuits of FIGS. 8d-8g are more like pure current sources than is the output portion of the circuit of FIG. 8b. Furthermore, like the circuit in FIG. 8b, the circuits of FIGS. 8d-8g can be extended to have more than one output stage.

Those of ordinary skill in the art will recognize that the examples given herein are illustrative only and that, for purposes of the present invention, two uni-directional current mirrors of any type can be connected together to form a CN circuit, as long as one current mirror is made using n-type transistors and the other current mirror is made using p-type transistors.

There are two ways that the CN circuits of the present invention can be made to have a current gain having a magnitude other than unity. First, the strengths of the transistors in the LVCC circuit can be made different from the strengths of the transistors in the LCVC circuit. The strength of a transistor is the ratio of its width to its length. When the strengths of the transistors are different, the CN circuit will be functional when the output transistors are in saturation. The current gain of the CN circuit is equal to the transistor strength ratio between the transistors in the LVCC circuit and the transistors in the LCVC circuit. This technique applies to the CN circuit of FIG. 8b.

The circuits of FIGS. 8d, 8e and 8g can also be made to have a current gain other than unity, by using a constant strength ratio between all of the transistors in the output stage and all of the transistors in the input stage.

A second way to obtain a current gain having a magnitude other than unity for the CN circuit shown in FIGS. 8b is to make the rail voltages $V_H$ and $V_L$ of the LVCC circuit portion different from the rail voltages $V_H$ and $V_L$ of the LCVC circuit portion. Under this circumstance, both the LCVC circuit 60 and the LVCC circuit 10 should be operated in their operating regimes as previously described herein. The absolute value of the current gain of the CN circuit of FIG. 8b is:

$$g = r \left( \frac{V_{Hout} - V_{Lout} + V_{T76} - V_{T78}}{V_{Hin} - V_{Lin} + V_{T72} - V_{T74}} \right) \quad (20)$$

where, r is the transistor strength ratio between the transistors of the LVCC circuit 10 and the LCVC circuit 60. If a zero output current is desired when a zero input current is applied to the circuit, then the following condition should be met:

$$V_{Hin} + V_{Lin} + V_{T72} + V_{T74} = V_{Hout} + V_{Lout} + V_{T76} + V_{T78} \quad (21)$$

Like conventional current mirror circuits from which they are made, the CN circuits of the present invention, including those depicted in FIGS. 8a, 8b, 8c and 8g–8g may be configured to have more than one output by connecting more than one output stage to the appropriate node or nodes of the input stage.

Figure 10A:
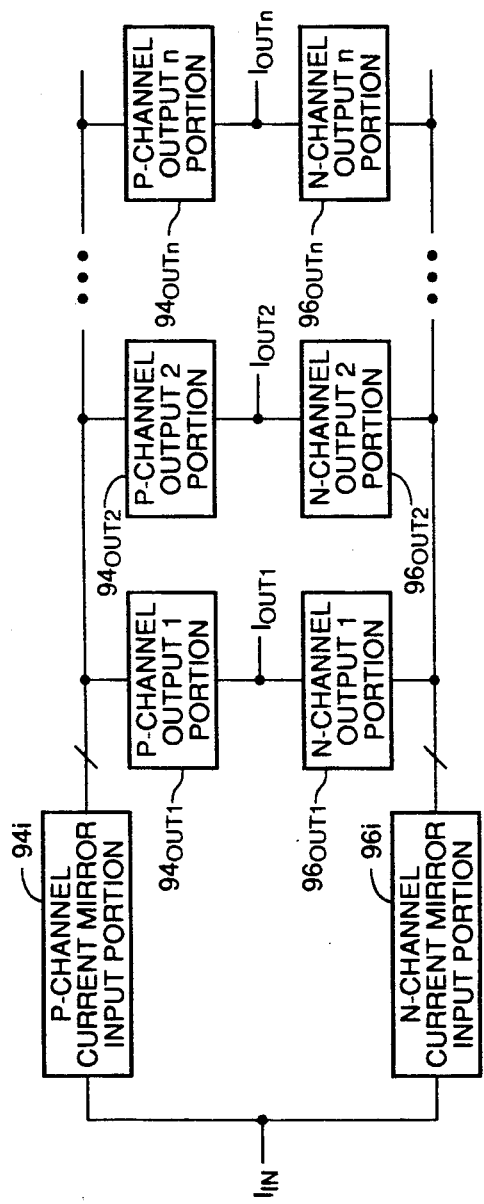
FIG. 10a is a block diagram illustrating the use of multiple output stages with the CN circuits disclosed herein.

Referring now to FIG. 10a, a schematic diagram an N-output scalable CN circuit according to the present invention is shown. Using the reference numerals from FIG. 8c, it may be seen that both the P-channel and the N-channel current mirrors may be conceptually divided into input sections $94_i$ and $96_i$, and output sections $94_{out1}$-$94_{outn}$ and $96_{out1}$-$96_{outn}$. Corresponding output sections are connected together to form output nodes $I_{out1}$, $I_{out2}$, and $I_{outn}$. Each output section may be tailored to have a current gain of other than one in the manner taught for the embodiment shown in FIG. 8b.

Figure 10B:
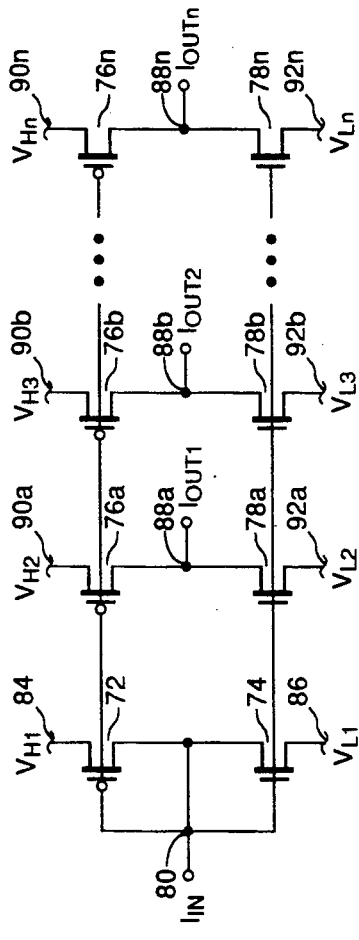
FIG. 10b is a schematic diagram of an example of a multiple output CN circuit according to the present invention.

As an example of the provision of multiple outputs in the CN circuits according to the present invention, FIG. 10b shows additional outputs provided to the CN circuits of FIG. 8b. The input stage of the CN circuit is formed from P-channel transistor 72 and N-channel transistor 74, connected to input node 80 and voltage rails 84 and 86 as shown in and described with reference to FIG. 8b.

A desired number of output stages may be connected to intermediate node 80. As shown in FIG. 10b, three illustrative output stages are connected to intermediate node 80. The first includes P-channel transistor 76a, connected to N-channel transistor 78a and to output node 88a and to voltage rails 90a and 92a in the manner described with respect to FIG. 8b. The second includes P-channel transistor 76b, connected to N-channel transistor 78b and to output node 88b and to voltage rails 90b and 92b in the same manner. The third includes P-channel transistor 76n, connected to N-channel transistor 78n and to output node 88n and to voltage rails 90n and 92n also in the manner described with respect to FIG. 8b.

The multiple output CN circuits of the present invention may be tailored to have different current gains in the manner taught herein with respect to the single output versions. For instance, those of ordinary skill in the art will appreciate that, by adjusting the transistor strength ratios or by properly choosing voltages for voltage rails 90a–c and 92 a–c, output nodes 88a–c may be caused to produce currents of magnitudes of other than $-1 \times I_{in}$.

Figure 11A:
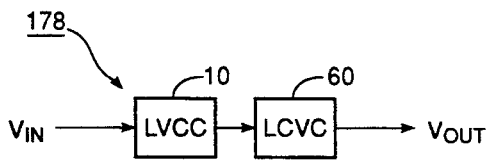
FIG. 11a is a block diagram of a voltage-negator circuit according to the present invention.

Another useful circuit realized by combining the circuits disclosed herein is a voltage-negator circuit, which is a combination of the LVCC circuit 10 of FIG. 1a or 1b driving the LCVC circuit 60 of FIG. 6a or 6b. An example of such a circuit is shown in FIG. 11a. Voltage negator circuit 180 includes LVCC circuit 10 followed by LCVC circuit 60.

Figure 11B:
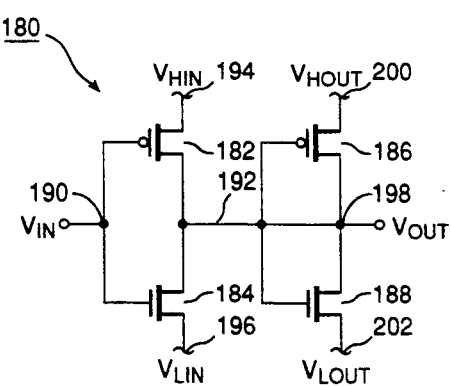
FIG. 11b is a schematic diagram of a voltage-negator circuit according to the present invention.

A particular embodiment of voltage-negator circuit 178 is shown in FIG. 11b and includes four MOS transistors, one P-channel transistor 182 and one N-channel transistor 184 in the input section and one P-channel transistor 186 and one N-channel transistor 188 in the output section. An input voltage $V_{in}$ is applied from an input node 190 to the gates of both transistors 182 and 184, which are connected together. The drains of transistors 182 and 184 are connected together to form an intermediate node 192. The source of the P-channel transistor 182 is connected to a first input voltage rail 194 having a first voltage potential $V_{Hin}$, and the source of the N-channel transistor 194 is connected to a second input voltage rail 196 having a second lower voltage potential $V_{Lin}$.

Intermediate node 192 is connected to the gates of P-channel transistor 186 and N-channel transistor 188. The drains of P-channel and N-channel transistors 186 and 188 are connected together to output node 198 as well as to intermediate node 192. The source of the P-channel transistor 186 is connected to a first output voltage rail 200 having a first voltage potential $V_{Hout}$, and the source of the N-channel transistor 188 is connected to a second output voltage rail 202 having a second lower voltage potential $V_{Lout}$.

Figure 12:
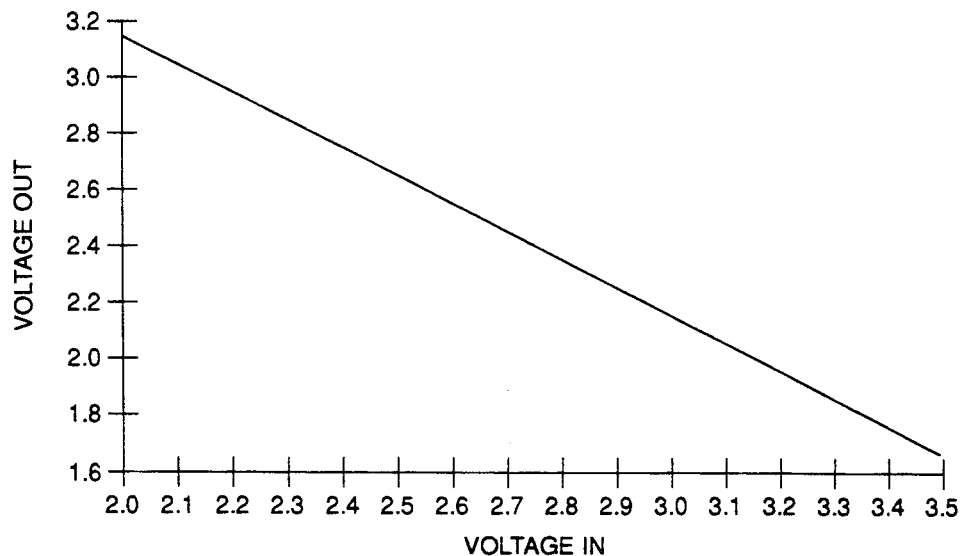
FIG. 12 is a graph showing the transfer function for the voltage-negator circuit of FIG. 11b.

The voltage negator circuit of FIG. 11b is functional when the LVCC circuit and LCVC circuit portions of the voltage-negator are in their functional regimes as described previously herein. The transfer function for the voltage negator circuit of FIG. 11b is shown in FIG. 12.

There are two ways in which the voltage negator circuit of FIGS. 11a and 11b may have a voltage gain different from one. First, the strengths of the transistors in the LVCC circuit portion of the voltage negator can be made different from the strengths of the transistors in the LCVC circuit portion. The voltage gain of the voltage-negator circuit of FIGS. 11a and 11b is the negative of the ratio of transistor strengths between the LVCC circuit portion and the LCVC circuit portion.

Second, the voltages $V_H$ and $V_L$ on the voltage rails of the LVCC circuit portion may be made different from the voltages $V_H$ and $V_L$ on the voltage rails of the LVCC circuit portion of the circuit. The absolute value of the voltage gain of the circuit is:

$$g = r \left( \frac{V_{Hin} - V_{Lin} + V_{T182} - V_{T184}}{V_{Hout} - V_{Lout} + V_{T186} - V_{T188}} \right) \quad (22)$$

where r is the transistor strength ratio between the LVCC portion and the LCVC circuit portion of the voltage-negator circuit and the subscript numbers correspond to the reference numbers of the various transistors in the circuit.

Figure 13:
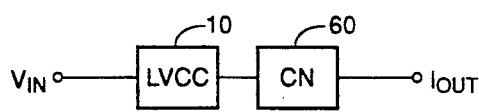
FIG. 13 is a block diagram of an inverting linear voltage-to-current converter (ILVCC) circuit according to the present invention by combining a LVCC circuit as an input to drive a CN circuit as an output.

An non-inverting linear voltage-to-current converter (ILVCC) circuit may be provided according to the present invention by combining a LVCC circuit of FIG. 1a as an input and a CN circuit of any one of FIGS. 8a–8e as an output. Such a combination is shown in block diagram form in FIG. 13. The output of the LVCC circuit is connected to the input of the CN circuit. The output current of the NLVCC circuit is linearly related to its input current, with the sign opposite to that of an LVCC circuit.

Figure 14:
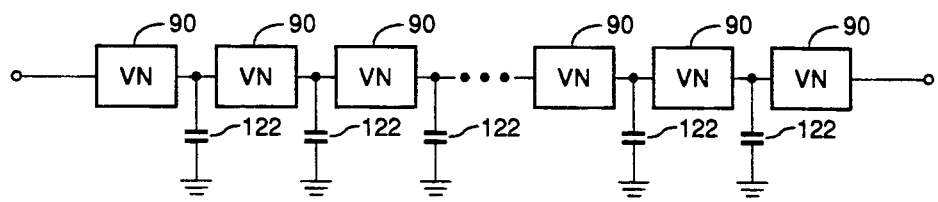
FIG. 14 is a block diagram of a delay line according to a presently preferred embodiment of the invention including a chain of voltage-negator circuits, like that of FIG. 11, connected in series, with capacitance on the output of each voltage-negator.

The principles and circuits of the present invention may be used to provide a delay line. Such a circuit is shown in block form in FIG. 14. A delay line 120 according to a presently preferred embodiment of the invention includes a chain of voltage-negator circuits 90, like that of FIG. 11a, connected in cascade, with capacitor 122 on the output of each voltage negator circuit 90. A delayed version of the original signal appears on the output of every even voltage-negator circuit 90 in delay line 120 and a delayed version of the inverted signal appears on the output of every odd voltage-negator circuit 90 in delay line 120. Those of ordinary skill in the art will recognize that an arbitrary number of voltage-negator circuits 90 may be used, depending on the delay desired, possibly subject to bandwidth limitations as described on page 154 of the book *Analog VLSI and Neural Systems*. The delay can be adjusted by adjusting $V_H$–$V_L$, and the gain can be adjusted by making $V_H$ and $V_L$ of the input sections of the voltage negator circuit slightly different from the $V_H$ and $V_L$ of the output sections.

Figure 15:
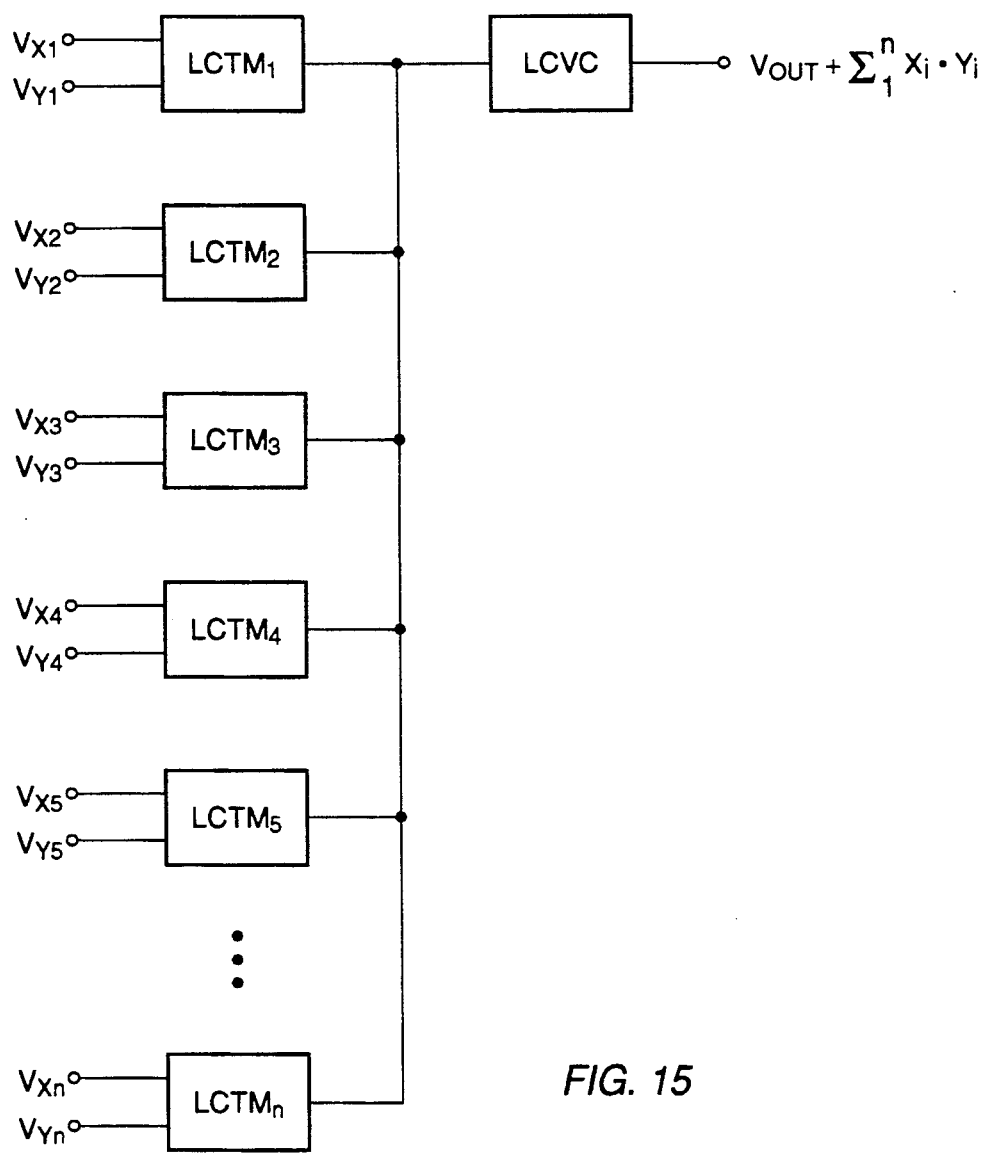
FIG. 15 is a block diagram of a linear neuron according to another aspect of the present invention, fabricated from a plurality of LCTM circuits and one LCVC circuit.

A linear neuron according to another aspect of the present invention may be fabricated from a plurality of LCTM circuits 32 (FIG.4) and one LCVC circuit 50 (FIG. 6) as shown in FIG. 15. If $x_i$ is defined as $V_{xi}$-$V_{x0}$ and $y_i$ is defined as $V_{yi}$-$V_{y0}$, where $V_{xi}$ are the $V_x$ inputs of a plurality of LCTM circuits 32, $V_{yi}$ are the $V_y$ inputs of the LCTM circuits, and where $V_{x0}$ and $V_{y0}$ are as previously defined herein, then the outputs of a plurality of LCTM circuits 32 are the dot products of the terms $x_i$ and $y_i$.

Figure 16:
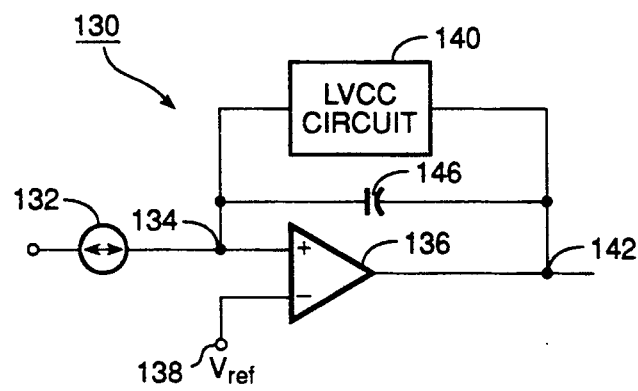
FIG. 16 is a schematic/block diagram of a sense amplifier circuit according to the present invention.

Because they are currents, the outputs of the LCTM circuits may be summed on a single wire. These outputs may be connected together to the input of the LCVC circuit 50 since its current driven input inherently sums the current components at its input node. The output voltage $V_{out}$ of the LVCC circuit of the linear neuron may be expressed as:

$$V_{out} = \sum_{i=1}^{i=n} x_i \cdot y_i \quad (23)$$

and is the dot product of the vectors $x_i$ and $y_i$, where i=0 to n. The principles and circuits of the present invention may also be used to provide a current sense amplifier. A current sense amplifier circuit 210 according to the present invention is shown in FIG. 16. A bi-directional current input, shown as a current source 132, is connected to node 134, the non-inverting input node of amplifier 136. Amplifier 136 may be one of a variety of available amplifier circuits, such as the one described in *Analog VLSI and Neural Systems*, p. 70, preferably having a voltage gain much larger than one. The inverting input node 138 to amplifier 136 is connected to a reference voltage $V_{ref}$. A LVCC circuit 140, such as that shown in FIGS. 1a and 1b, is placed in a feedback path from the output of amplifier 136 to its non-inverting input node 134. The input to the LVCC circuit 140 and the output of the current sense amplifier 130 is output 142 of amplifier 136.

The purpose of the circuit 130 is to hold non-inverting input node 134 at the same voltage as inverting input node 138 of the amplifier 136, and to generate an output voltage at output node 142 which is a linear function of the current provided by the input current source 132.

The sense amplifier of FIG. 16 is linear because the LVCC circuit 138 is linear. A change in the output voltage at output node 142 will cause a proportional change in the output current of the LVCC.

In order to make the circuit more stable, a compensation capacitor 146 may be connected between non-inverting input node 132 and the output of transconductance amplifier 136. Those of ordinary skill in the art can adjust the output impedance of amplifier 136, the transconductance of the LVCC circuit 140, and the compensation capacitor 146 in order to yield desired speed and phase margin for the whole current sense amplifier 130.

The LVCC circuit 140 is kept in its operating range by choice of reference voltage at inverting input node 138 of transconductance amplifier 136, which constrains the voltage on node 132, and, when given a range of input current, by choice of the transconductance of the LVCC circuit 140, which constrains the voltage on the output of transconductance amplifier 136.

While a presently-preferred embodiment of the invention has been disclosed, from an examination of the within disclosure and drawings, those of ordinary skill in the art will be able to configure other embodiments of the invention. These other embodiments are intended to fall within the scope of the present invention which is to be limited only by the scope of the appended claims.

What is claimed is:

1. A current sense amplifier, including:
   a non-inverting amplifier having an input node and an output node;
   a voltage-to-current converter circuit, having an input node connected to the output node of said amplifier and an output node connected to the input node of said amplifier;
   a capacitor connected between said input node and said output node of said non-inverting amplifier;

wherein said voltage-to-current converter circuit includes a P-channel MOS transistor having its drain connected to the drain of an N-channel MOS transistor to form the output node of said voltage-to-current converter circuit, and having its gate connected to the gate of said N-channel MOS transistor to form the input node of said voltage-to-current converter circuit, the source of said P-channel MOS transistor connected to a first voltage rail and the source of said N-channel MOS transistor connected to a second voltage rail, more negative than said first voltage rail.

2. A current sense amplifier, including:

a non-inverting amplifier having an input node and an output node;

a voltage-to-current converter circuit, having an input node connected to the output node of said amplifier and an output node connected to the input node of said amplifier;

a capacitor connected between said input node and said output node of said non-inverting amplifier;

wherein said voltage-to-current circuit includes a P-channel MOS transistor having its drain connected to the drain of an N-channel MOS transistor to form the output node of said voltage-to-current converter circuit, and having its gate connected to the gate of said N-channel MOS transistor to form the input node of said voltage-to-current converter circuit, the source of said P-channel MOS transistor connected to at least one diode connected P-channel MOS transistor in series with a first voltage rail and the source of said N-channel MOS transistor connected to at least one diode connected N-channel MOS transistor in series with a second voltage rail, said second voltage rail being more negative than said first voltage rail.

* * * * *